United States Patent [19]

Thornberg

[11] Patent Number: 5,303,121
[45] Date of Patent: Apr. 12, 1994

[54] MULTI-CHIP MODULE BOARD

[75] Inventor: Gary R. Thornberg, Colorado Springs, Colo.

[73] Assignee: NCR Corporation, Dayton, Ohio

[21] Appl. No.: 996,993

[22] Filed: Dec. 28, 1992

[51] Int. Cl.[5] .............................................. H05K 7/02
[52] U.S. Cl. ................................. 361/760; 361/748; 361/729; 361/785; 361/736; 174/52.1; 174/52.4; 174/255
[58] Field of Search ............... 361/736, 744, 748, 729, 361/760, 761, 764, 767, 778, 784, 785; 174/52.1, 52.4, 255; 257/686

[56] References Cited

U.S. PATENT DOCUMENTS

| 4,706,166 | 10/1987 | Go | 361/403 |
|---|---|---|---|
| 4,891,789 | 1/1990 | Quattrini et al. | 365/63 |
| 4,983,533 | 1/1991 | Go | 437/7 |
| 4,998,180 | 3/1991 | McAuliffe et al. | 361/383 |

Primary Examiner—Leo P. Picard
Assistant Examiner—Young Whang
Attorney, Agent, or Firm—James M. Stover

[57] ABSTRACT

A multi-chip module board includes a multi-chip module substrate; a first multi-chip module designed and assembled into the substrate; and a space on the substrate configured to receive an additional add-on multi-chip module, memory module or component module and to operatively connect the add-on module to the first multi-chip module. The first multi-chip module contains integrated and discrete circuit elements necessary to provide basic functionality required by the board user. Space and connecting structure is provided on the module board for the connection of add-on modules which provide additional or peripheral functionality to the board. The connecting structures included on the module board and the add-on modules are designed to permit the attachment of any one of several different function add-on modules to a location on the module board.

12 Claims, 3 Drawing Sheets

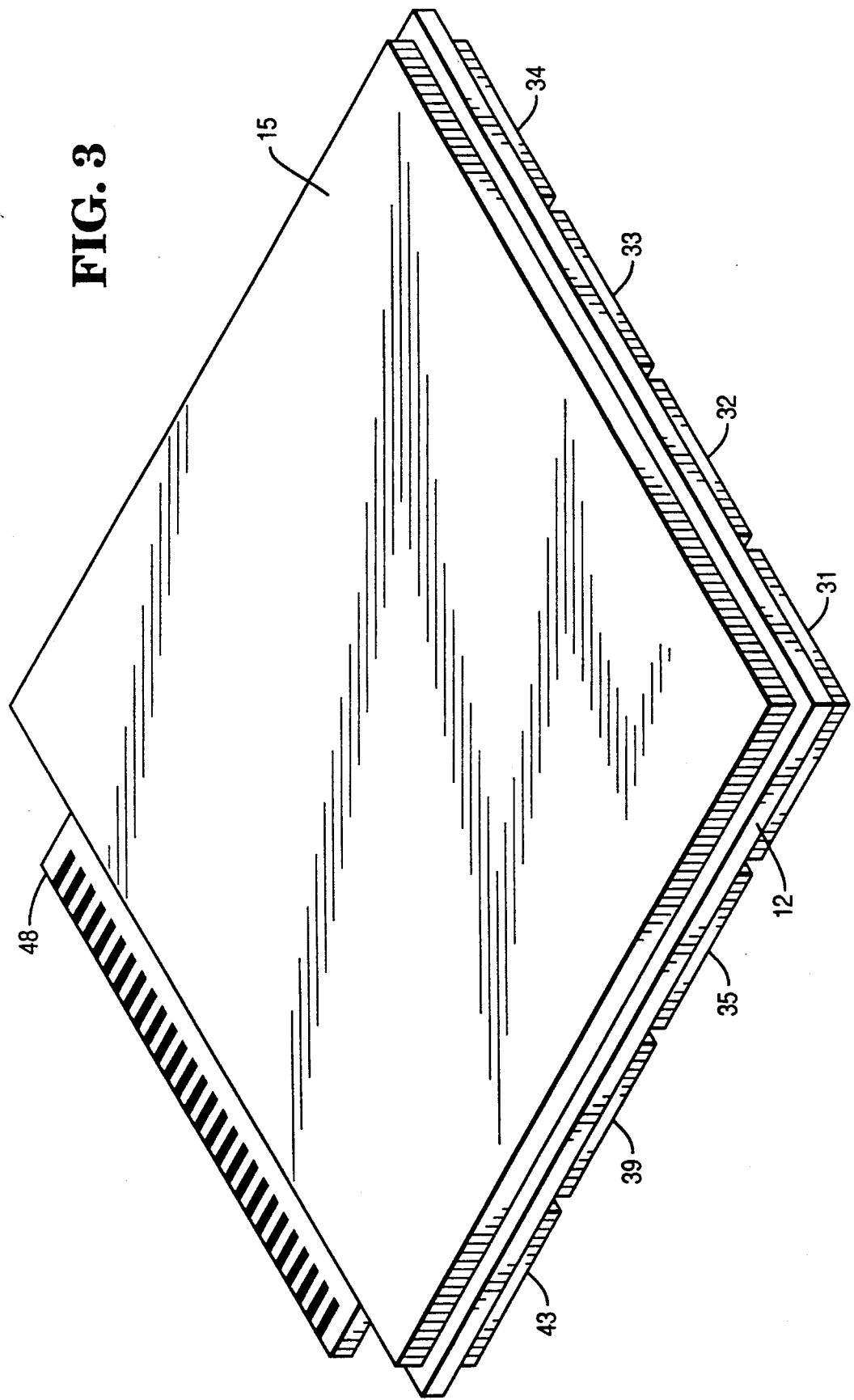

MULTI-CHIP MODULE BOARD

The present invention relates generally to the interconnection of integrated circuits, and more particularly, to a multi-chip module board capable of supporting multiple multi-chip modules, memory modules and other add-on components on a single high density substrate.

BACKGROUND OF THE INVENTION

A multi-chip module (MCM) is defined as any advanced semiconductor substrate which provides an interconnect path between electrical components mounted thereon. The electrical components are often integrated circuits, but may also comprise discrete circuit components such as resistors, capacitors, inductors, transistors and diodes.

With the arrival of higher speed computer processors, e.g. 66 megahertz and greater, the need to accelerate other computer functions has become evident. The slower speed of the memory bus and other peripherals, such as a coprocessor, limit the overall performance of the computer system and restrict the benefits to be gained from the higher speed processor. The incorporation of peripheral functions onto multi-chip modules provides a method for increasing the speed of those operations.

As the inclusion and arrangement of components on a multi-chip module will vary according to each application, the process to prepare a multi-chip module for each application must also be varied. Those skilled in the art will recognize that there are numerous benefits to be gained from standardizing the process of manufacturing multi-chip modules.

OBJECTS OF THE INVENTION

It is therefore an object of the present invention to provide a new and useful multi-chip module board.

It is another object of the present invention to provide such a multi-chip module board which can be customized through the attachment of additional multi-chip modules, memory modules or other components.

It is yet another object of the present invention to provide multi-chip module arrangement including a main board and one or more additional multi-chip modules attached thereto.

It is still a further object of the present invention to provide a multi-chip module board including circuit structure for performing a standard set of functions and a set of option locations permitting the attachment of additional multi-chip modules, memory modules or other components for performing optional functions.

SUMMARY OF THE INVENTION

There is provided, in accordance with the present invention, a multi-chip module board, comprising: a multi-chip module substrate; a first multi-chip module built into or secured to the substrate; and a space on the substrate configured to receive an additional add-on multi-chip module, memory module or component module and to operatively connect the add-on module to the first multi-chip module.

In the described embodiment, the multi-chip module board is rectangular shaped. The first multi-chip module, containing integrated and discrete circuit elements necessary to provide basic functionality required by the board user, is mounted in the center of the module board. Space and connecting structure is provided on two sides of the main module for the connection of add-on modules which provide additional or peripheral functionality to the board. The connecting structures included on the module board and the add-on modules are designed to permit the attachment of any one of several different function add-on modules to a location on the module board.

The above and other objects, features, and advantages of the present invention will become apparent from the following description and the attached drawings.

BRIEF DESCRIPTION OF THE DRAWING

Referring to the Figures, wherein like numerals represent like parts throughout the several views:

FIG. 3 provides a view of the underside of the multi-chip module board shown in FIG. 2.

DETAILED DESCRIPTION OF A PREFERRED

Those skilled in the art will recognize that the components and circuitry on a multi-chip module will vary according to each application. With the foregoing in mind, the present invention provides a multi-chip module board having mounted thereto a main multi-chip module possessing standard functionality and additional area and structure on the board for the connection of additional multi-chip modules, memory modules or component modules providing specific optional functionality. Two possible embodiments of the present invention will now be described with reference to FIGS. 1 through 3.

Figure 1:
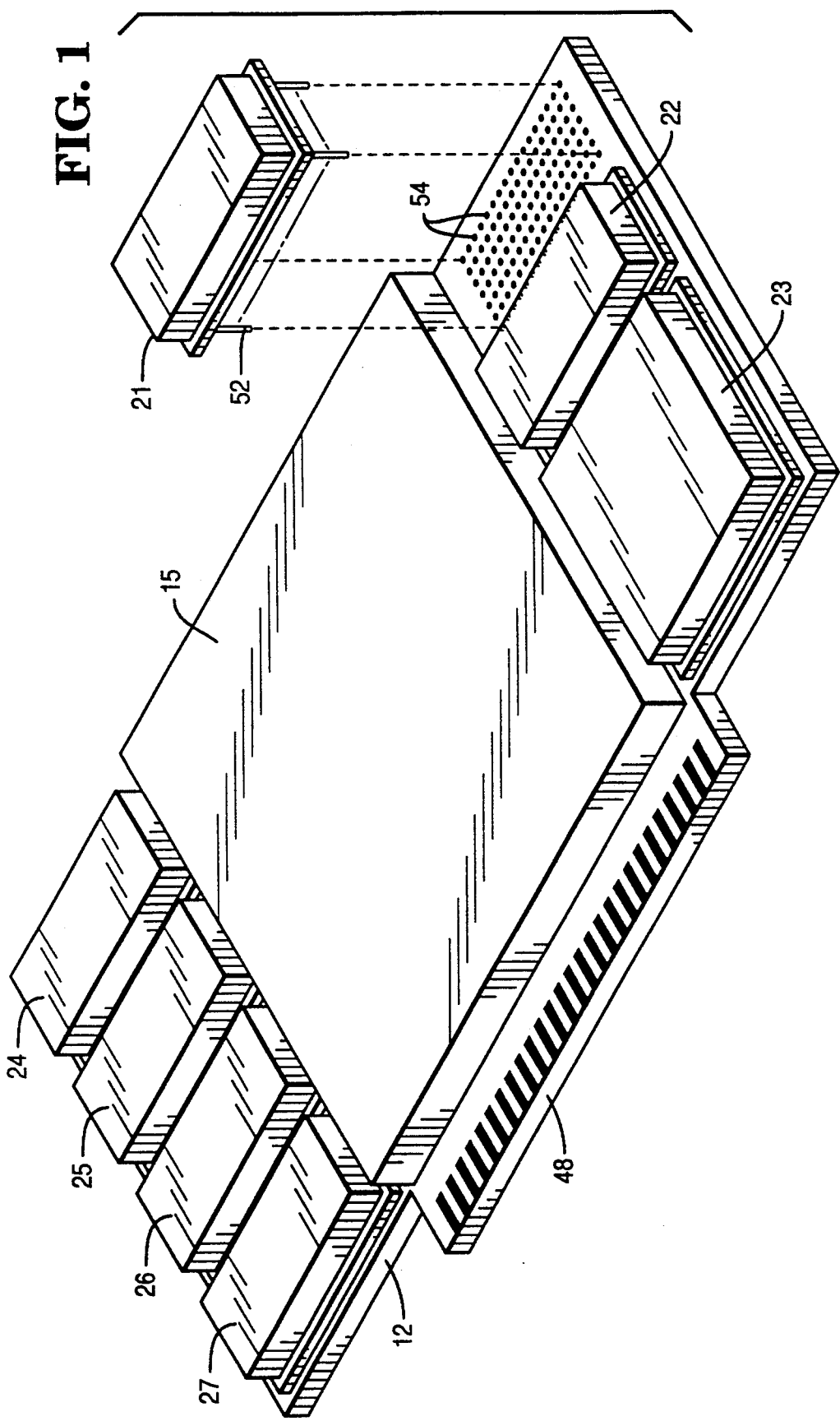
FIG. 1 is a perspective view of a multi-chip module built into or mounted on a rectangular module board including additional area adjacent the multi-chip module for the connection of additional multi-chip modules, memory module or other components in accordance with the present invention.

FIG. 1 is a perspective view of a rectangular multi-chip module (MCM) board 12 and a main multi-chip module 15 built into or mounted on the board. Space is provided on board 12 left and right of main module 15 for the connection of additional modules 21 through 27. MCM board 12 is a high density substrate manufactured utilizing standard MCM technology, such as cofired aluminum with CU/PI, Al N with CU/PI, or Al N only. PGA, edge or bottom connectors are provided for connecting the module board to other computer system components. An edge connector 48 is illustrated in FIG. 1.

Main module 15 contains integrated and discrete components necessary to provide basic functionality required by the board user. The components are housed under a protective lid. The add-on modules 21 through 27 are attached to the board to provide additional or peripheral functionality. The additional modules could include, for example, a SCSI chip, a math coprocessor, memory, a testing cache or other integrated or discrete components. Connecting structure is included on board 12 for mating with the add-on modules. This connecting structure could comprise solder balls, SMT, PGA sockets, bump connection, or any other known connecting means. The connecting structure for module 21 shown in FIG. 1 comprises pin connectors 52 positioned on the bottom of add-on module 21 and corresponding pin holes 54 in the MCM board substrate.

The connecting structures included on board 12 and the add-on modules are preferably designed such that a common connecting interface is provided. This common interface would permit the attachment of any one of several different function add-on modules to a location on board 12.

The board design shown in FIG. 1 provides connection for add-on modules on two sides of main module 15. The board design can easily be expanded to provide MCM module attachment area on all four sides of main MCM module 15.

Figure 2:
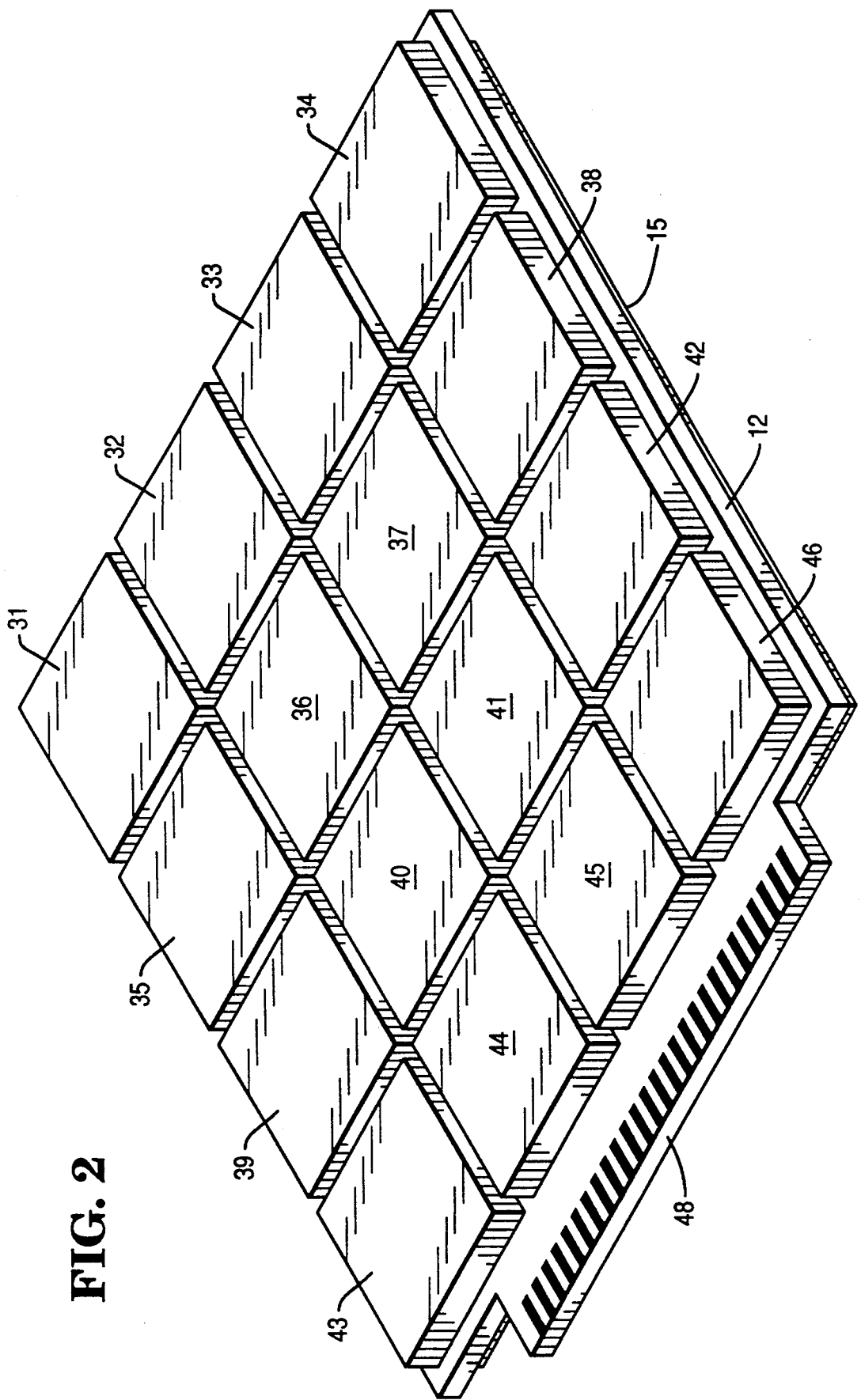
FIG. 2 provides a perspective view of a multi-chip module mounted on one side of a rectangular module board including additional area on the second side of the module board for the connection of additional multi-chip modules, memory modules or other components in accordance with another embodiment of the present invention.

FIGS. 2 and 3 show another embodiment of the present invention wherein main MCM module 15 occupies all of one side of MCM board 12. FIG. 2 shows a plurality of add-on MCM modules 31 through 46 optionally connected to the top side of board 12. Main module 15 is connected to the bottom side of board 12 as shown in FIG. 3. An edge connector 48 provides for connection of the module board to other computer system components.

The board, connecting structures, and add-on modules are manufactured as set forth above in the description of the embodiment of the invention shown in FIG. 1.

The invention as described above provides a multi-chip module "motherboard" which includes a main MCM module providing standard functionality and provisions for the attachment of additional MCM modules, memory modules or other components empowering the MCM board with specific, optional, high performance functionality. The MCM board includes a first area permanently occupied by the main MCM module with the remainder of the MCM board providing contact area for the connection of additional, optional MCM modules, single chip packages, or other discrete components. Alternatively, the main MCM module may occupy one side of the MCM motherboard while the other side of the MCM board provides contact area for the additional MCM modules or single chip packages.

The primary advantage provided by the MCM board structure described above is capability of operating computer peripherals and options at greater speeds, e.g., processor speed, thereby improving overall system performance.

Those skilled in the art will recognize that the preceding description of a preferred embodiment was merely for purposes of illustration and explanation. For example, the shape of the board and layout of modules, components and connecting structure can be varied from that shown in FIGS. 1 and 2. Those skilled in the art will also recognize that a variety of applications and modifications to the present invention would fall within the scope of the present invention. Accordingly, the present invention is to be limited only by the appended claims.

What is claimed is:

1. A multi-chip module board, comprising:
   (a) a multi-chip module substrate;
   (b) a first multi-chip module secured to said substrate; and
   (c) a space on said substrate configured to receive a second multi-chip module and to operatively connect said second multi-chip module to said first multi-chip module, wherein said second multi-chip module is selected from a group of optional multi-chip modules, each member of said group being designed to provide an additional functionality to said multi-chip module board, all members of said group having a common connecting interface providing connection to said substrate.

2. The multi-chip module board according to claim 1, wherein said substrate has a first side and a second side, and said first multi-chip module is secured to said first side, and said space is located on said first side.

3. The multi-chip module board according to claim 2, further comprising another space, on said second side of said substrate, configured to receive a third multi-chip module and to operatively connect said third multi-chip module to said first multi-chip module.

4. The multi-chip module board according to claim 3, further comprising an edge connector operatively connected to said first multi-chip module and extending to a peripheral portion of said substrate.

5. The multi-chip module board according to claim 1, wherein said substrate has a first side and a second side, and said first multi-chip module is secured to said first side and said space is located on said second side.

6. The multi-chip module board according to claim 5, further comprising an edge connector operatively connected to said first multi-chip module and extending to a peripheral portion of said substrate.

7. The multi-chip module board according to claim 1, further comprising an edge connector operatively connected to said first multi-chip module and extending to a peripheral portion of said substrate.

8. The multi-chip module board according to claim 1, further comprising a second multi-chip module secured to said space on said substrate and operatively connected to said first multi-chip module.

9. A multi-chip module board, comprising:
   (a) a high density substrate;
   (b) a main multi-chip module operatively connected to said substrate;
   (c) a customizing means, operatively connected to said substrate, for customizing the board to provide an additional functionality, and including a connecting means for operatively connecting a customized set of additional multi-chip modules to said main multi-chip module, wherein said customized set is selected from a group of customized sets, each of which is designed to provide an additional functionality, and said customizing means is configured to accommodate each member set within said group of customized sets.

10. The multi-chip module board according to claim 9, wherein:
   said connecting means is a set of spaces on said substrate sufficient in number to accommodate all of the multi-chip modules in any one of said group of customized sets.

11. The multi-chip module board according to claim 9, wherein:
   at least one of said spaces is configured to accommodate more than one type of multi-chip module.

12. The multi-chip module board according to claim 9, wherein:
   the number of spaces in said set of spaces is less than the number of discrete multi-chip modules in all of the customized sets in said group of customized sets.

* * * * *